US008628268B2

(12) United States Patent
Kellogg et al.

(10) Patent No.: US 8,628,268 B2
(45) Date of Patent: Jan. 14, 2014

(54) CAM LOCK ELECTRODE CLAMP

(75) Inventors: Michael C. Kellogg, Oakland, CA (US);
Anthony J. Norell, McKinleyville, CA (US); Anthony de la Llera, Fremont, CA (US); Rajinder Dhindsa, San Jose, CA (US)

(73) Assignee: Lam Research Corporation, Fremont, CA (US)

( * ) Notice: Subject to any disclaimer, the term of this patent is extended or adjusted under 35 U.S.C. 154(b) by 276 days.

(21) Appl. No.: 12/922,382

(22) PCT Filed: Mar. 13, 2009

(86) PCT No.: PCT/US2009/001593
§ 371 (c)(1),
(2), (4) Date: Sep. 13, 2010

(87) PCT Pub. No.: WO2009/114175
PCT Pub. Date: Sep. 17, 2009

(65) Prior Publication Data
US 2011/0042879 A1  Feb. 24, 2011

Related U.S. Application Data

(60) Provisional application No. 61/036,862, filed on Mar. 14, 2008.

(51) Int. Cl.
*B25B 5/08* (2006.01)
(52) U.S. Cl.
USPC .......................... 403/362; 403/348; 403/349
(58) Field of Classification Search
USPC ........... 403/230, 231, 245, DIG. 12; 438/710; 269/138, 196, 229, 233; 156/345.34
See application file for complete search history.

(56) References Cited

U.S. PATENT DOCUMENTS

| 2,377,458 A | * | 6/1945 | Stalkup | 219/143 |
| 3,251,616 A | * | 5/1966 | Garstang et al. | 403/370 |

(Continued)

FOREIGN PATENT DOCUMENTS

| JP | 05096056 | 4/1993 |
| JP | 02198353 | 7/2002 |

(Continued)

OTHER PUBLICATIONS

"International Application Serial No. PCT/US2009/001593, Search Report mailed Nov. 3, 2009", 3 pgs.

(Continued)

*Primary Examiner* — Lee D Wilson
*Assistant Examiner* — Joel Crandall
(74) *Attorney, Agent, or Firm* — Schwegman Lundberg & Woessner, P.A.

(57) ABSTRACT

A cam lock clamp comprises a stud having a substantially cylindrical body with a first end including a head area and a second end arranged to support one or more disc springs concentrically about the stud. A socket is arranged to mechanically couple concentrically around the stud with the head area of the stud being exposed above an uppermost portion of the socket. The socket is configured to be firmly attached to a consumable material. A camshaft has a substantially cylindrical body and is configured to mount within a bore of a backing plate. The camshaft further comprises an eccentric cutout area located in a central portion of the camshaft body. The camshaft is configured to engage and lock the head area of the stud when the consumable material and the backing plate are proximate to one another.

20 Claims, 4 Drawing Sheets

(56) References Cited

U.S. PATENT DOCUMENTS

| | | | |
|---|---|---|---|
| 3,268,983 A * | 8/1966 | Straub | 29/898.047 |
| 3,339,411 A * | 9/1967 | Riffie | 73/304 R |
| 3,730,568 A * | 5/1973 | Giovannetti | 403/245 |
| 4,202,645 A * | 5/1980 | Giovannetti | 403/231 |
| 4,518,278 A * | 5/1985 | Koch | 403/230 |
| 4,599,011 A * | 7/1986 | Tashiro et al. | 403/245 |
| 4,728,215 A * | 3/1988 | Martincic et al. | 403/231 |
| 4,863,326 A * | 9/1989 | Vickers | 411/105 |
| 4,869,564 A * | 9/1989 | Lechman | 312/195 |
| 4,883,383 A * | 11/1989 | Challis | 403/314 |
| 4,947,690 A * | 8/1990 | Cleveland | 73/654 |
| 4,990,020 A * | 2/1991 | Matsui | 403/20 |
| 5,567,081 A * | 10/1996 | Vallance | 403/292 |
| 5,590,975 A * | 1/1997 | Horntvedt | 403/320 |
| 5,676,487 A * | 10/1997 | Lautenschlager et al. | 403/231 |
| 5,772,353 A * | 6/1998 | Grieser et al. | 403/231 |
| 6,036,782 A * | 3/2000 | Tanaka et al. | 118/715 |
| 6,151,203 A | 11/2000 | Shamouilian et al. | |
| 6,200,415 B1 * | 3/2001 | Maraschin | 156/345.52 |
| 6,352,038 B1 * | 3/2002 | Nelson et al. | 108/27 |
| 6,461,435 B1 * | 10/2002 | Littau et al. | 118/715 |
| 6,936,135 B2 * | 8/2005 | Antolik | 156/345.53 |
| 7,211,170 B2 * | 5/2007 | Antolik | 156/345.53 |
| 7,296,534 B2 * | 11/2007 | Fink | 118/723 E |
| 7,430,986 B2 * | 10/2008 | Dhindsa et al. | 118/723 E |
| 7,481,903 B2 * | 1/2009 | Senzaki et al. | 156/345.43 |
| 7,827,931 B2 * | 11/2010 | Matsushima et al. | 118/723 E |
| 7,856,044 B2 * | 12/2010 | Sandstrom et al. | 372/87 |
| 8,161,906 B2 * | 4/2012 | Kadkhodayan et al. | 118/723 E |
| 8,221,582 B2 * | 7/2012 | Patrick et al. | 156/345.34 |
| 8,313,805 B2 * | 11/2012 | Kadkhodayan et al. | 427/248.1 |
| 8,414,719 B2 * | 4/2013 | Patrick et al. | 156/1 |
| 8,419,959 B2 * | 4/2013 | Bettencourt et al. | 216/67 |
| 8,470,127 B2 * | 6/2013 | de la Llera et al. | 156/345.43 |
| 2006/0266852 A1 * | 11/2006 | Choi | 239/548 |
| 2008/0087641 A1 * | 4/2008 | De La Llera et al. | 216/67 |

FOREIGN PATENT DOCUMENTS

| | | |
|---|---|---|
| JP | 03142359 | 5/2003 |
| KR | 2008086226 A * | 9/2008 |
| WO | WO-2009114175 A2 | 9/2009 |
| WO | WO-2009114175 A3 | 12/2009 |

OTHER PUBLICATIONS

"International Application Serial No. PCT/US2009/001593, Written Opinion mailed Nov. 3, 2009", 3 pgs.

* cited by examiner

US 8,628,268 B2

CAM LOCK ELECTRODE CLAMP

RELATED APPLICATIONS

This application is a U.S. National Stage Filing under 35 U.S.C. §371 from International Application Serial No. PCT/US2009/001593, filed on Mar. 13, 2009, and published in English as WO 2009/114175 A2 on Sep. 17, 2009, which claims priority to U.S. Provisional Application Ser. No. 61/036,862, filed Mar. 14, 2008 and entitled "Cam Lock Electrode Clamp," which applications are hereby incorporated by reference in their entirety.

TECHNICAL FIELD

The present invention relates generally to the field of process equipment used in the semiconductor, data storage, flat panel display, as well as allied or other industries. More particularly, the present invention relates to a cam-operated clamp for attaching an electrode or other material to a backing plate within the process equipment.

BACKGROUND

Semiconductor device geometries (i.e., integrated circuit design rules) have decreased dramatically in size since such devices were first introduced several decades ago. Integrated circuits (ICs) have generally followed "Moore's Law," which means that the number of devices which will fit on a single integrated circuit chip doubles every two years. Today's IC fabrication facilities are routinely producing 65 nm (0.065 µm) feature size devices, and future fabs soon will be producing devices having even smaller feature sizes.

Commonly used and critical processes employed in fabs include dry plasma etching, reactive ion etching, and ion milling techniques. These techniques were developed in order to overcome numerous limitations associated with chemical etching of semiconductor wafers. Plasma etching, in particular, allows a vertical etch rate to be made much greater than a corresponding horizontal etch rate so that a resulting aspect ratio of the etched features can be adequately controlled.

During the plasma etching process, a plasma is formed above the masked surface of the wafer by adding large amounts of energy to a gas at relatively low pressure, resulting in an ionized gas. By adjusting the electrical potential of the substrate to be etched, charged species in the plasma can be directed to impinge substantially normally upon the wafer wherein materials in the unmasked regions of the wafer are removed.

The etching process can often be made more effective by using gases that are chemically reactive with the material being etched. Reactive ion etching (RIE) combines energetic etching effects of the plasma with a chemical etching effect of the gas. However, many chemically-active agents have been found to cause excessive electrode wear. The worn electrodes need to be quickly and efficiently replaced in order to maintain high process yields within the fab.

A reactive ion etching system typically consists of an etching chamber with an upper electrode (an anode) and a lower electrode (a cathode) positioned therein. The cathode is negatively biased with respect to the anode and the chamber walls. The wafer to be etched is covered by a suitable mask and placed directly on the cathode (e.g., typically an electrostatic chuck). A chemically reactive gas such as carbon tetrafluoride ($CF_4$), trifluoromethane ($CHF_3$), chlorotrifluoromethane ($CClF_3$), sulfur hexafluoride ($SF_6$), or mixtures thereof, is combined with oxygen ($O_2$), nitrogen ($N_2$), helium (He), or argon (Ar) and introduced into the etching chamber and maintained at a pressure which is typically in the millitorr range.

The upper electrode is typically provided with gas apertures which permit the input gas to be uniformly dispersed through the electrode into the chamber. The electric field established between the anode and the cathode dissociates the reactive gas, thus forming a plasma. The surface of the wafer is etched by chemical interaction with the active ions and by momentum transfer of the ions striking unmasked portions of the wafer. The electric field created by the electrodes will attract the ions to the cathode, causing the ions to strike the wafer in a predominantly vertical direction so that the process produces well-defined vertically etched side walls.

With reference to FIG. 1, a typical prior art showerhead electrode assembly 100 for a single wafer etcher is used in which a wafer is supported and spaced one to two centimeters below a silicon electrode 101. An upper surface of the outer edge of the silicon electrode 101 is metallurgically bonded by, for example, silicone or an indium or indium alloy solder to a graphite supporting ring 109. The silicon electrode 101 is a planar disk having uniform thickness from center to edge thereof. The silicon electrode 101 may also take other forms, such as an annular ring. An outer flange on the graphite supporting ring 109 is clamped by an aluminum clamping ring 113 to an aluminum support member 105. The aluminum support member 105 has a peripheral water cooling channel 111. A plasma confinement ring 107 comprised of a Teflon® support ring 107A and an annular Vespel® insert 107B surrounds the outer periphery of the silicon electrode 101.

The purpose and function of the plasma confinement ring 107 is to increase the electrical resistance between the walls of the reaction chamber and the plasma, thereby confining the plasma more directly between the upper and lower electrodes. The aluminum clamping ring 113 is attached to the aluminum support member 105 by a plurality of circumferentially spaced-apart stainless steel bolts threaded into the aluminum support member 105. The plasma confinement ring 107 is attached to the aluminum clamping ring 113 by a plurality of circumferentially spaced-apart bolts threaded into the aluminum clamping ring 113. A radially inwardly-extending flange of the aluminum clamping ring 113 engages the outer flange of the graphite support ring 109. Thus, no clamping pressure is applied directly against the exposed surface of the silicon electrode 101.

Process gas is supplied to the silicon electrode 101 through a central hole 115 in the aluminum support member 105. The process gas is then dispersed through one or more vertically spaced apart baffle plates 103 and passes through gas dispersion holes (not shown) in the silicon electrode 101 to evenly disperse the process gas into the reaction chamber (i.e., the reaction chamber is immediately below the silicon electrode 101).

In order to provide enhanced heat conduction between the graphite support ring 109 and the aluminum support member 105, part of the process gas is supplied through a first gas passage orifice 119 to fill a small annular groove in the aluminum support member 105. In addition, a second gas passage orifice 117 in the plasma confinement ring 107 permits pressure to be monitored in the reaction chamber. To maintain process gas under pressure between the aluminum support member 105 and the graphite support ring 109, a first O-ring seal 121 is provided between a radially inner surface of the graphite support ring 109 and a radially outer surface of the aluminum support member 105. A second O-ring seal 123 is provided between an outer part of an upper surface of the graphite support ring 109 and a lower surface of the aluminum support member 105.

A difficult and time-consuming prior art process of bonding the silicon electrode 101 to the graphite support ring 109 requires heating the silicon electrode 101 to a bonding temperature which may cause bowing or cracking of the electrode 101 due to the different thermal coefficients of expansion of the silicon electrode 101 and the graphite support ring 109. Also, contamination of wafers could result from solder particles or vaporized solder contaminants deriving from the joint between the silicon electrode 101 and the graphite support ring 109 or from the ring itself. The problem with such particulates or other contaminants becomes far more pronounced with sub-65 nanometer design rules employed in contemporaneous IC designs.

In the silicon electrode 101 bonding process, the temperature of the electrode 101 may even become high enough to melt the solder and cause either part or the entire electrode 101 to separate from the graphite support ring 109. However, even if the silicon electrode 101 becomes only partly separated from the graphite support ring 109, local variations in electrical and thermal power transmission between the graphite support ring 109 and the silicon electrode 101 could result in a non-uniform plasma density beneath the electrode 101.

Therefore, what is needed is an efficient means of mounting an electrode to a support or backing ring that is simple, robust, and cost-effective. Also, the mounting means must account for any induced stresses due to thermal coefficient differences between the electrode and the support member.

SUMMARY

In an exemplary embodiment, a cam lock clamp is disclosed. The cam lock clamp comprises a stud having a body portion, a first end portion, and a second end portion. The first end portion includes a head area having a first diameter larger than a cross-sectional dimension of the body portion; the second end portion includes a second diameter larger than the cross-sectional dimension of the body portion and arranged to support one or more disc springs concentrically about the stud. A socket is arranged to mechanically couple concentrically around the stud and the supported one or more disc springs with the head area of the stud being exposed above an uppermost portion of the socket. The socket is configured to be firmly attached to a consumable material. The cam lock clamp also comprises a camshaft with a substantially cylindrical body with a diameter larger than the first diameter. The camshaft is configured to mount within a bore of a backing plate and further comprises an eccentric cutout area located in a central portion of the cylindrical camshaft body. The camshaft is further configured to engage and lock the head area of the stud when the consumable material and the backing plate are proximate to one another.

In another exemplary embodiment, a cam lock clamp is disclosed. The cam lock clamp comprises a stud having a body portion, a first end portion, and a second end portion. The first end portion includes a head area having a first diameter larger than a cross-sectional dimension of the body portion; the second end portion includes a second diameter larger than the cross-sectional dimension of the body portion and arranged to support one or more disc springs concentrically about the stud. A socket is arranged to mechanically couple concentrically around the stud and the supported one or more disc springs with the head area of the stud being exposed above an uppermost portion of the socket. The socket is configured to be firmly attached to a backing plate. The cam lock clamp also comprises a camshaft with a substantially cylindrical body with a diameter larger than the first diameter. The camshaft is configured to mount within a bore of a consumable material and further comprises an eccentric cutout area located in a central portion of the cylindrical camshaft body. The camshaft is further configured to engage and lock the head area of the stud when the backing plate and the consumable material are proximate to one another.

In another exemplary embodiment, a cam lock clamp for use in a semiconductor process tool is disclosed. The cam lock clamp comprises a stud having a substantially cylindrical body portion, a first end portion, and a second end portion. The first end portion comprises a head area having a first diameter larger than a diameter of the substantially cylindrical stud body portion. The second end has a second diameter larger than the diameter of the cylindrical stud body portion and is arranged to support a plurality of disc springs concentrically about the stud. A socket is arranged to mechanically couple concentrically around the stud and the supported plurality of disc springs with the head area of the stud being exposed above an uppermost portion of the socket. The socket is configured to be firmly attached to an electrode located within the semiconductor process tool. A camshaft having a substantially cylindrical body with a diameter larger than the first diameter is configured to mount within a bore of a backing plate located with the semiconductor process tool and further comprising an eccentric cutout area located in a central portion of the cylindrical camshaft body. The camshaft is further configured to engage and lock the head area of the stud when the electrode material and the backing plate are proximate to one another. The cam lock clamp further comprises a pair of camshaft bearings having an inside diameter and an outside diameter. The inside diameter is sized such that the pair of camshaft bearings are mountable over opposite ends of the camshaft and the outside diameter is sized to be larger than the diameter of the camshaft.

BRIEF DESCRIPTION OF THE DRAWINGS

The appended drawings illustrate exemplary embodiments of the present invention and must not be considered as limiting its scope.

DETAILED DESCRIPTION

Figure 1:
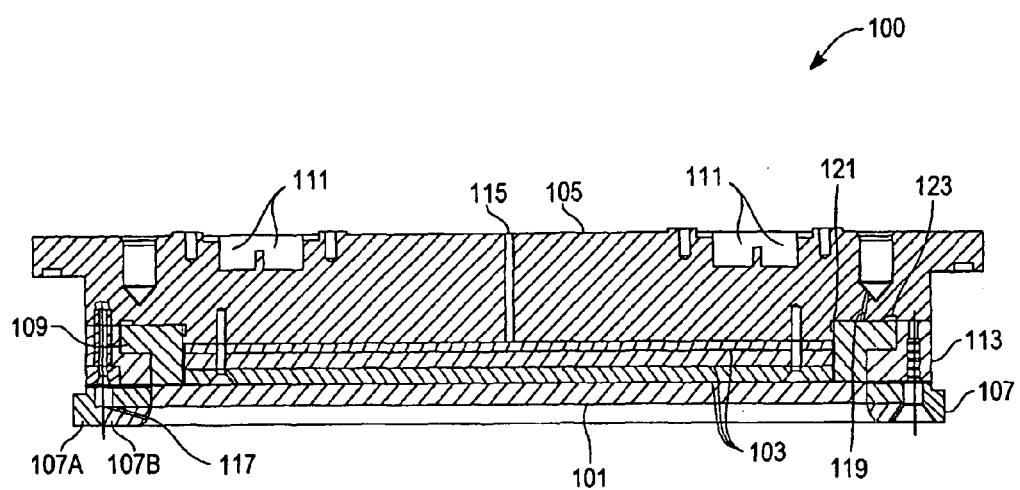
FIG. 1 is a cross-sectional view of a plasma showerhead of the prior art.
Figure 2A:
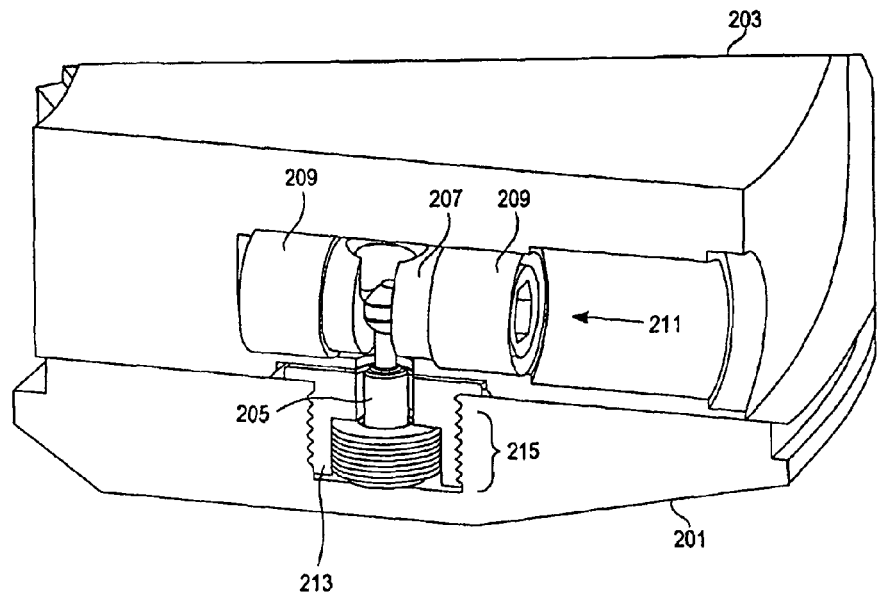
FIG. 2A is a three-dimensional representation of an exemplary cam lock electrode clamp in accordance with the present invention.

With reference to FIG. 2A, a three-dimensional view of an exemplary cam lock electrode clamp of the present invention includes portions of an electrode 201 and a backing plate 203 to exemplify to a skilled artisan how the cam lock electrode clamp functions. The electrode clamp is capable of quickly, cleanly, and accurately attaching a consumable electrode 201 to a backing plate in a variety of fab-related tools, such as a dielectric etch chamber (not shown). The electrode 201 may be comprised of a variety of materials including, for example, silicon (Si), silicon carbide (SiC), or polysilicon (α-Si). The backing plate is frequently comprised of aluminum although other materials are known in the art.

Comprising portions of the electrode clamp, a stud 205 is mounted into a socket 213. The stud may be surrounded by a disc spring stack 215, such, for example, stainless steel Belleville washers. The stud 205 and disc spring stack 215 may then be press-fit or otherwise fastened into the socket 213 through the use of adhesives or mechanical fasteners. The stud 205 and the disc spring stack 215 are arranged into the socket 213 such that a limited amount of lateral movement is possible between the electrode 201 and the backing plate 203. Limiting the amount of lateral movement allows for a tight fit between the electrode 201 and the backing plate 203, thus ensuring good thermal contact, while still providing some movement to account for differences in thermal expansion between the two parts. Additional details on the limited lateral movement feature are discussed in more detail, below.

In a specific exemplary embodiment, the socket 213 is fabricated from bearing-grade Torlon®. Alternatively, the socket 213 may be fabricated from other materials possessing certain mechanical characteristics such as good strength and impact resistance, creep resistance, dimensional stability, radiation resistance, and chemical resistance may be readily employed. Various materials such as polyamides, polyimides, acetals, and ultra-high molecular weight polyethylene materials may all be suitable. High temperature-specific plastics and other related materials are not required for forming the socket 213 as 230° C. is a typical maximum temperature encountered in applications such as etch chambers. Generally, a typical operating temperature is closer to 130° C.

Other portions of the electrode clamp are comprised of a camshaft 207 surrounded at each end by a pair of camshaft bearings 209. The camshaft 207 and camshaft bearing assembly is mounted into a backing plate bore 211 machined into the backing plate 203. In a typical application for an etch chamber (not shown) designed for 300 mm semiconductor wafers, eight or more of the electrode clamps may be spaced around the periphery of the electrode 201/backing plate 203 combination.

The camshaft bearings 209 may be machined from a variety of materials including Torlon®, Vespel®, Celcon®, Delrin®, Teflon®, Arlon®, or other materials such as fluoropolymers, aceta ls, polyamides, polyimides, polytetrafluoroethylenes, and polyetheretherketones (PEEK) having a low coefficient of friction and low particle shedding. The stud 205 and camshaft 207 may be machined from stainless steel (e.g., 316, 316L, 17-7, etc.) or any other material providing good strength and corrosion resistance.

Figure 2B:
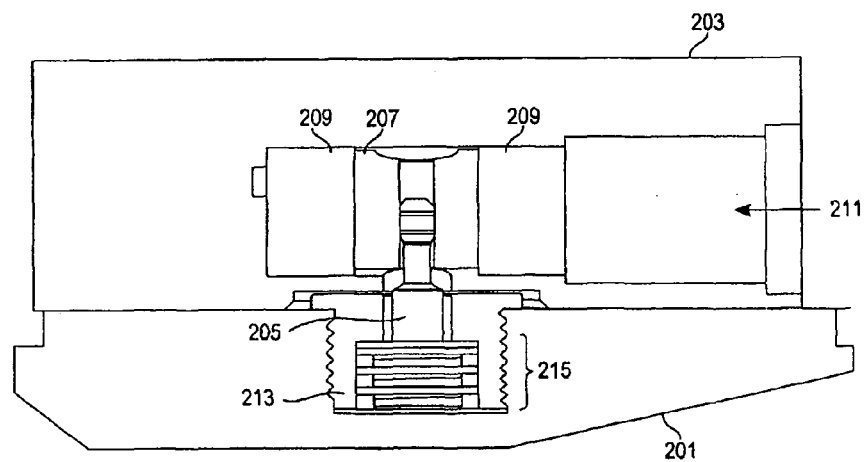
FIG. 2B is a cross-sectional view of the exemplary cam lock electrode clamp of FIG. 2A.

Referring now to FIG. 2B, a cross-sectional view of the electrode cam clamp further exemplifies how the cam clamp operates by pulling the electrode 201 in close proximity to the backing plate 203. The stud 205/disc spring stack 215/socket 213 assembly is mounted into the electrode 201. As shown, the assembly may be screwed, by means of external threads on the socket 213 into a threaded pocket in the electrode 201. However, a skilled artisan will recognize that the socket may be mounted by adhesives or other types of mechanical fasteners as well.

Figure 3:
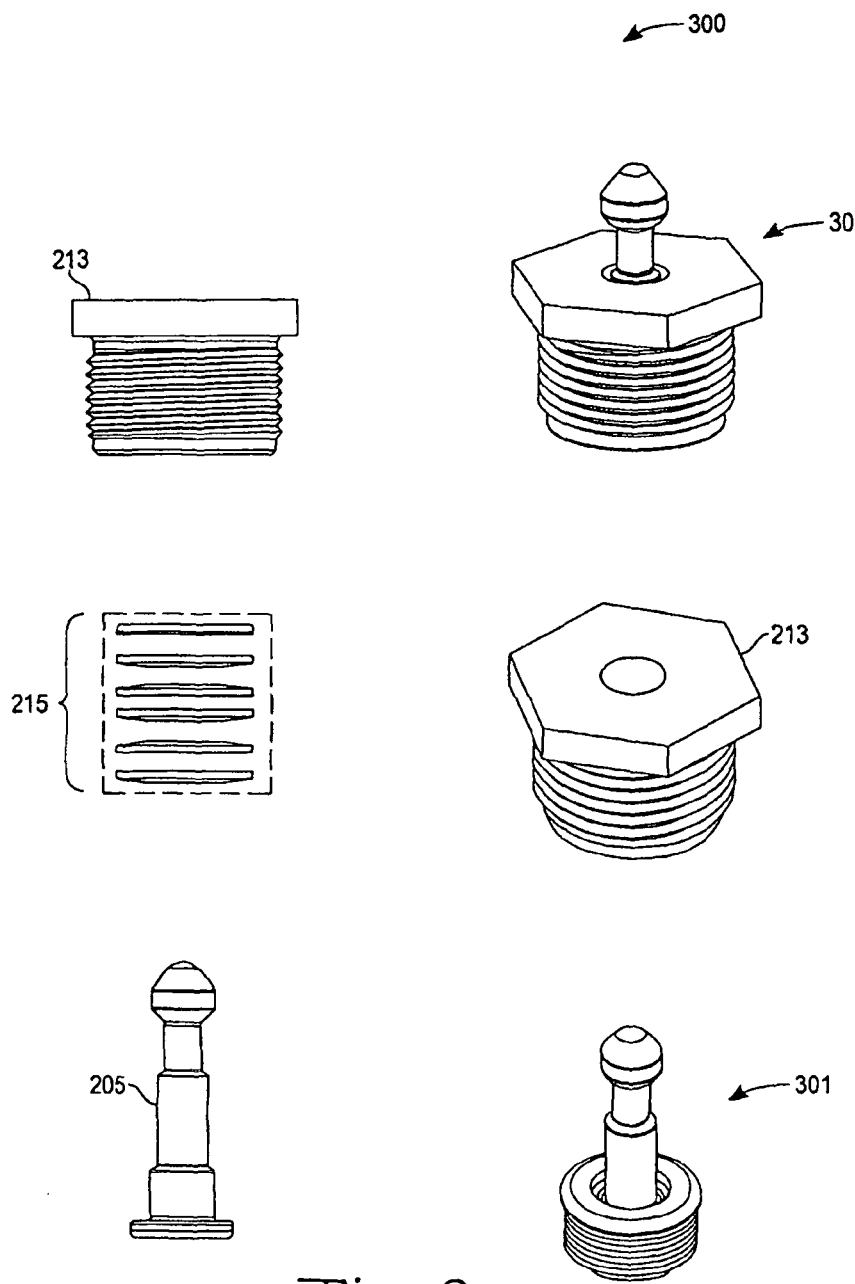
FIG. 3 shows side-elevation and assembly drawings of an exemplary stud used in the cam lock clamp of FIGS. 2A and 2B.

In FIG. 3, an elevation and assembly view 300 of the stud 205, disc spring stack 215, and socket 213 provides additional detail into an exemplary design of the cam lock electrode clamp. In a specific exemplary embodiment, a stud/disc spring assembly 301 is press fit into the socket 213. The socket 213 has an external thread and a hexagonal top member (or any other shape such as, for example, polygonal, Torx®, Robertson, etc.) allowing for easy insertion into the electrode 201 (see FIGS. 2A and 2B) with light torque (e.g., in a specific exemplary embodiment, about 20 inch-pounds). As indicated above, the socket 213 may be machined from various types of plastics. Using plastics minimizes particle generation and allows for a gall-free installation of the socket 213 into a mating pocket on the electrode 201.

The stud/socket assembly 303 illustrates an inside diameter in an upper portion of the socket 213 being larger than an outside diameter of a mid-section portion of the stud 205. The difference in diameters between the two portions allows for the limited lateral movement in the assembled electrode clamp as discussed above. The stud/disc spring assembly 301 is maintained in rigid contact with the socket 213 at a base portion of the socket 213 while the difference in diameters allows for some lateral movement. (See also, FIG. 2B.)

Figure 4A:
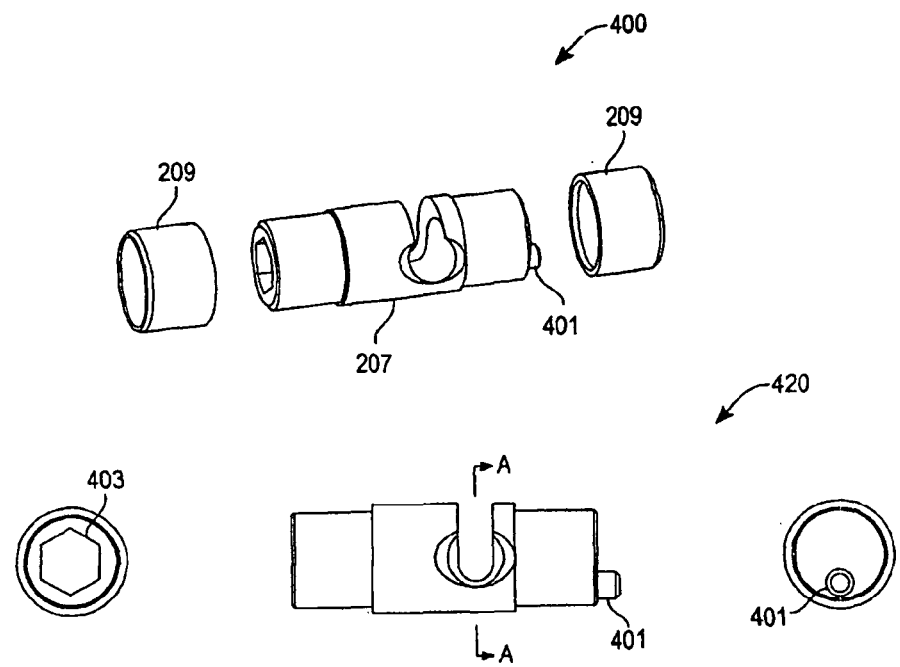
FIG. 4A shows side-elevation and assembly drawings of an exemplary cam shaft used in the cam lock clamp of FIGS. 2A and 2B.

With reference to FIG. 4A, an exploded view 400 of the camshaft 207 and camshaft bearings 209 also indicates a keying pin 401. The end of the camshaft 207 having the keying pin 401 is first inserted into the backing plate bore 211 (see FIG. 2B). A half-moon shaped slot (not shown) at a far end of the backing plate bore 211 provide proper alignment of the camshaft 207 into the backing plate bore 211. The half-moon shaped slot limits rotational travel of the camshaft 207 thus preventing damage to the stud 205. A side-elevation view 420 of the camshaft 207 clearly indicates a possible placement of a hex opening 403 on one end of the camshaft 207 and the keying pin 401 on the opposite end.

For example, with continued reference to FIGS. 4A and 2B, the electrode cam clamp is assembled by inserting the camshaft 207 into the backing plate bore 211. The keying pin 401 limits rotational travel of the camshaft 207 in the backing plate bore 211 by interfacing with one of the pair of small mating holes. The camshaft may first be turned in one direction through use of the hex opening 403, for example, counter-clockwise, to allow entry of the stud 205 into the camshaft 207, and then turned clockwise to fully engage and lock the stud 205. The clamp force required to hold the electrode 201 to the backing plate 203 is supplied by compressing the disc spring stack 215 beyond their free stack height. The camshaft 207 has an internal eccentric cutout which engages the head of the stud 205. As the disc spring stack 215 compresses, the clamp force is transmitted from individual springs in the disc spring stack 215 to the socket 213 and through the electrode 201 to the backing plate 203.

In an exemplary mode of operation, once the camshaft bearings are attached to the camshaft 207 and inserted into the backing plate bore 211, the camshaft 207 is rotated counter-clockwise to its full rotational travel. The stud/socket assembly 303 (FIG. 3) is then lightly torqued into the electrode 201. The head of the stud 205 is then inserted into the through hole below the backing plate bore 211. The electrode 201 is held against the backing plate 203 and the camshaft 207 is rotated clockwise until either the keying pin 401 travels until it contacts the end of the half-moon shaped slot (not shown) or an audible click is heard (discussed in detail, below). The exemplary mode of operation may simply be reversed to dismount the electrode 201 from the backing plate 203.

Figure 4B:
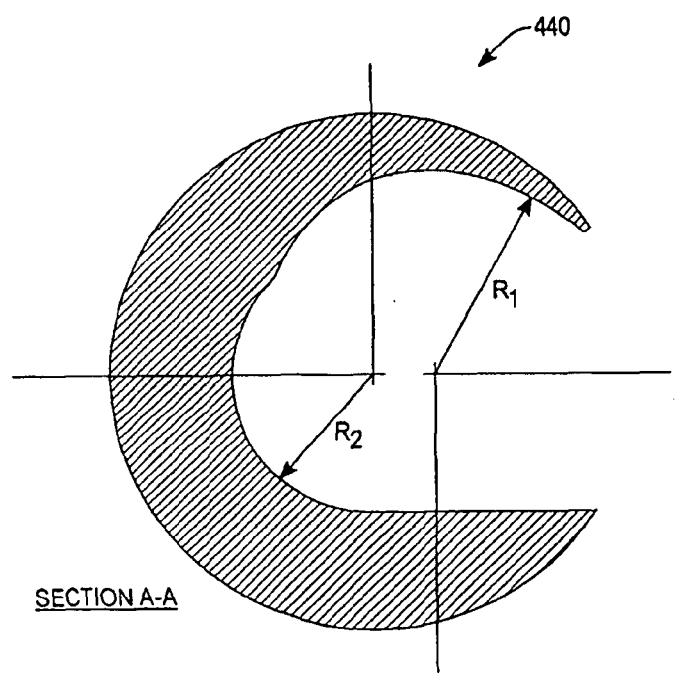
FIG. 4B shows a cross-sectional view of an exemplary cutter-path edge of a portion of the cam shaft of FIG. 4A.

With reference to FIG. 4B, a sectional view A-A of the side-elevation view 420 of the camshaft 207 of FIG. 4A indicates a cutter path edge 440 by which the head of the stud 205 is fully secured. In a specific exemplary embodiment, the two radii $R_1$ and $R_2$ are chosen such that the head of the stud 205 makes the audible clicking noise described above to indicate when the stud 205 is fully secured.

The present invention is described above with reference to specific embodiments thereof. It will, however, be evident to a skilled artisan that various modifications and changes can be made thereto without departing from the broader spirit and scope of the present invention as set forth in the appended claims. For example, particular embodiments describe a number of material types and locations of various elements of the electrode cam clamp. A skilled artisan will recognize that these materials and particular elements are flexible and are shown herein for exemplary purposes only in order to fully illustrate the novel nature of the clamp. Additionally, a skilled artisan will further recognize that various mounting configurations are possible such as reversing a location of the clamp by mounting the stud assembly into the backing plate and the camshaft into the backing plate. Also, the clamp may be used in a variety of different materials on a variety of, for example, process, metrology, and analytical tools within a fab. Moreover, the term semiconductor should be construed throughout to include data storage, flat panel display, as well as allied or other industries. These and various other embodiments are all within a scope of the present invention. The specification and drawings are, accordingly, to be regarded in an illustrative rather than a restrictive sense.

What is claimed is:

1. A cam lock clamp, comprising:
   a disc spring stack comprising a number of disc springs;
   a stud having a body portion, a first end portion, and a second end portion, the first end portion comprising a head area having a first diameter larger than a cross-sectional dimension of the body portion, the second end portion having a second diameter larger than the cross-sectional dimension of the body portion and arranged to support the disc spring stack concentrically about the stud, the stud configured to be non-rotatably affixed to a consumable electrode in a semiconductor plasma processing environment;
   a socket arranged to mechanically couple concentrically around the stud and the supported disc spring stack with the head area of the stud exposed above an uppermost portion of the socket, the socket configured to be firmly attached to the consumable electrode, the disc spring stack being arranged within the socket to limit lateral movement of the stud in a direction substantially normal to a longitudinal axis of the stud, the disc spring stack and the stud arranged to be in rigid contact with the socket at a base portion of the socket; and
   a camshaft having a substantially cylindrical body with a diameter larger than the first diameter of the head area, the camshaft being configured to mount within a bore of a backing plate and further comprising an eccentric cutout area located in a central portion of the cylindrical camshaft body, the camshaft being further configured to rotatably engage and lock the head area of the stud when the consumable electrode and the backing plate are proximate to one another, the longitudinal axis of the stud being substantially normal to a longitudinal axis of the camshaft upon the rotatable engagement of the camshaft to the stud.

2. The cam lock clamp of claim 1 wherein the camshaft further comprises a first end and a second end, the first end having a keying pin configured to engage a slot in the backing plate, the second end having an opening arranged to rotate the camshaft to fully engage the head area of the stud thereby clamping the consumable electrode to the backing plate.

3. The cam lock clamp of claim 1 further comprising a pair of camshaft bearings having an inside diameter and an outside diameter, the inside diameter sized such that the pair of camshaft bearings are mountable over opposite ends of the camshaft, the outside diameter sized to be larger than the diameter of the camshaft and smaller than the bore of the backing plate.

4. The cam lock clamp of claim 3 wherein the camshaft bearings are comprised of a substantially non-particle shedding material.

5. The cam lock clamp of claim 1 wherein the eccentric cutout area of the camshaft further comprises a cross-sectional area defined by a cutter path edge having a first and a second radius, the first radius arranged to tightly pull the head area of the stud toward the backing plate as the camshaft is rotated and the second radius configured to lock the head area of the stud in proximity to the backing plate as the camshaft is additionally rotated, the second radius further configured to provide an audible clicking noise to indicate when the stud is fully secured.

6. The cam lock clamp of claim 1 wherein the consumable electrode is configured to be mounted within an etch chamber.

7. The cam lock clamp of claim 1 wherein the stud, the socket, and the camshaft are each comprised of materials capable of withstanding a 230° C. environment.

8. The cam lock clamp of claim 1 wherein the socket has external threads.

9. A cam lock clamp, comprising:
   a disc spring stack comprising a number of disc springs;
   a stud having a body portion, a first end portion, and a second end portion, the first end portion comprising a head area having a first diameter larger than a cross-sectional dimension of the body portion, the second end portion having a second diameter larger than the cross-sectional dimension of the body portion and arranged to support the disc spring stack concentrically about the stud, the stud configured to be non-rotatably affixed to a consumable electrode in a plasma etch system;
   a socket arranged to mechanically couple concentrically around the stud and the supported one or more disc springs with the head area of the stud exposed above an uppermost portion of the socket, the socket configured to be firmly attached to the consumable electrode, the disc spring stack and the stud arranged to be in rigid contact with the socket at a base portion of the socket; and
   a camshaft having a substantially cylindrical body with a diameter larger than the first diameter of the head area, the camshaft being configured to mount within a bore of a backing plate and further comprising an eccentric cutout area located in a central portion of the cylindrical camshaft body, the camshaft being further configured to rotatably engage and lock the head area of the stud when the consumable electrode and the backing plate are proximate to one another, a longitudinal axis of the stud being substantially normal to a longitudinal axis of the camshaft upon the rotatable engagement of the camshaft to the stud.

10. The cam lock clamp of claim 9 wherein the camshaft further comprises a first end and a second end, the first end having a keying pin configured to engage a slot in the backing plate, the second end having an opening arranged to rotate the camshaft to fully engage the head area of the stud thereby clamping the backing plate to the consumable electrode.

11. The cam lock clamp of claim 9 further comprising a pair of camshaft bearings having an inside diameter and an outside diameter, the inside diameter sized such that the pair of camshaft bearings are mountable over opposite ends of the camshaft, the outside diameter sized to be larger than the diameter of the camshaft and smaller than the bore of the consumable electrode.

12. The cam lock clamp of claim 11 wherein the camshaft bearings are comprised of a substantially non-particle shedding material.

13. The cam lock clamp of claim 9 wherein the eccentric cutout area of the camshaft further comprises a cross-sectional area defined by a cutter path edge having a first and a second radius, the first radius arranged to tightly pull the head area of the stud toward the backing plate as the camshaft is rotated and the second radius configured to lock the head area of the stud in proximity to the backing plate as the camshaft is additionally rotated, the second radius further configured to provide an audible clicking noise to indicate when the stud is fully secured.

14. The cam lock clamp of claim 9 wherein the socket has external threads.

15. A cam lock clamp for use in a semiconductor plasma etch tool, the cam lock clamp comprising:

a disc spring stack comprising a number of disc springs;

a stud having a substantially cylindrical body portion, a first end portion, and a second end portion, the first end portion comprising a head area having a first diameter larger than a diameter of the substantially cylindrical stud body portion, the second end portion having a second diameter larger than the diameter of the cylindrical stud body portion and arranged to support the disc spring stack concentrically about the stud, the stud configured to be non-rotatably affixed to a backing plate;

a socket arranged to mechanically couple concentrically around the stud and the supported disc spring stack with the head area of the stud exposed above an uppermost portion of the socket, the socket configured to be firmly attached to a consumable electrode located within the semiconductor plasma etch tool, the disc spring stack being arranged within the socket to limit lateral movement of the stud in a direction substantially normal to a longitudinal axis of the stud, the disc spring stack and the stud arranged to be in rigid contact with the socket at a base portion of the socket;

a camshaft having a substantially cylindrical body with a diameter larger than the first diameter of the head area, the camshaft configured to mount within a bore of the consumable electrode located with the semiconductor plasma etch tool and further comprising an eccentric cutout area located in a central portion of the cylindrical camshaft body, the camshaft being further configured to rotatably engage and lock the head area of the stud when the consumable electrode and the backing plate are proximate to one another, the longitudinal axis of the stud being substantially normal to a longitudinal axis of the camshaft upon the rotatable engagement of the camshaft to the stud; and a pair of camshaft bearings having an inside diameter and an outside diameter, the inside diameter sized such that the pair of camshaft bearings are mountable over opposite ends of the camshaft, the outside diameter sized to be larger than the diameter of the camshaft and smaller than the bore of the consumable electrode.

16. The cam lock clamp of claim 15 wherein the camshaft further comprises a first end and a second end, the first end having a keying pin configured to engage a slot machined into the backing plate, the second end having an opening arranged to rotate the camshaft to fully engage the head area of the stud thereby clamping the consumable electrode to the backing plate.

17. The cam lock clamp of claim 15 wherein the camshaft bearings are comprised of a substantially non-particle shedding material.

18. The cam lock clamp of claim 15 wherein the eccentric cutout area of the camshaft further comprises a cross-sectional area defined by a cutter path edge having a first and a second radius, the first radius arranged to tightly pull the head area of the stud toward the backing plate as the camshaft is rotated and the second radius configured to lock the head area of the stud in proximity to the backing plate as the camshaft is additionally rotated, the second radius further configured to provide an audible clicking noise to indicate when the stud is fully secured.

19. The cam lock clamp of claim 15 wherein the stud, the socket, the camshaft, and the camshaft bearings are each comprised of materials capable of withstanding a 230° C. environment.

20. The cam lock clamp of claim 15 wherein the socket has external threads.

* * * * *